(12) United States Patent
Choi et al.

(10) Patent No.: US 12,465,956 B2
(45) Date of Patent: Nov. 11, 2025

(54) SUBSTRATE PROCESSING APPARATUS AND SUBSTRATE PROCESSING METHOD

(71) Applicant: SEMES CO., LTD., Cheonan-si (KR)

(72) Inventors: Junhee Choi, Cheonan-si (KR); Tae-keun Kim, Cheonan-si (KR); Kang Sul Kim, Cheonan-si (KR); Kyeong Min Lee, Cheonan-si (KR); Yong Jun Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 31 days.

(21) Appl. No.: 18/516,821

(22) Filed: Nov. 21, 2023

(65) Prior Publication Data

US 2024/0173752 A1  May 30, 2024

(30) Foreign Application Priority Data

Nov. 30, 2022 (KR) .................. 10-2022-0164391

(51) Int. Cl.
| | |
|---|---|
| *B08B 13/00* | (2006.01) |
| *B08B 3/02* | (2006.01) |
| *B08B 3/08* | (2006.01) |
| *B08B 3/12* | (2006.01) |
| *B08B 5/02* | (2006.01) |
| *H01L 21/02* | (2006.01) |
| *H01L 21/67* | (2006.01) |

(52) U.S. Cl.
CPC .................. *B08B 3/08* (2013.01); *B08B 3/02* (2013.01); *B08B 3/12* (2013.01); *B08B 5/02* (2013.01); *B08B 13/00* (2013.01); *H01L 21/02057* (2013.01); *H01L 21/67051* (2013.01); *B08B 2203/02* (2013.01)

(58) Field of Classification Search
None
See application file for complete search history.

(56) References Cited

U.S. PATENT DOCUMENTS

| 6,893,805 B2 | 5/2005 | Iseki et al. |
| 7,757,626 B2 | 7/2010 | Shinya et al. |

(Continued)

FOREIGN PATENT DOCUMENTS

| JP | 2007-054798 | 3/2007 |
| JP | 2007-165695 | 6/2007 |

(Continued)

OTHER PUBLICATIONS

Google Patents translation of KR20100067313A (Year: 2025).*

*Primary Examiner* — Eric W Golightly

(57) ABSTRACT

Disclosed are a substrate processing apparatus and a substrate processing method that allow a chemical liquid to penetrate deeply into a gap between patterns of a substrate. The substrate processing apparatus includes a chamber having a processing space defined therein in which a substrate is processed; a chuck installed in the processing space and configured to support the substrate thereon; a chemical liquid supply formed on top of the chuck and configured to supply a chemical liquid droplet toward an upper surface of the substrate supported on the chuck; and a pressurizer formed on top of the chuck and configured to pressurize the chemical liquid droplet supplied on the upper surface of the substrate so that the pressed chemical liquid droplet fills a gap between patterns formed on the substrate.

14 Claims, 9 Drawing Sheets

(56) References Cited

U.S. PATENT DOCUMENTS

| | | | |
|---|---|---|---|
| 10,998,183 B2 | 5/2021 | Kaneko et al. | |
| 2014/0041803 A1* | 2/2014 | Koshizawa | H01L 21/6708 156/345.19 |
| 2020/0180108 A1* | 6/2020 | Kaneshige | B24B 57/02 |

FOREIGN PATENT DOCUMENTS

| | | |
|---|---|---|
| JP | 2008-272902 | 11/2008 |
| KR | 10-0498129 | 4/2003 |
| KR | 10-2010-0067313 | 6/2010 |
| KR | 10-1874526 | 2/2014 |
| KR | 10-2017-0059720 | 5/2017 |
| KR | 10-2287439 | 11/2020 |

\* cited by examiner

SUBSTRATE PROCESSING APPARATUS AND SUBSTRATE PROCESSING METHOD

CROSS-REFERENCE TO RELATED PATENT APPLICATION

This application claims the benefit of Korean Patent Application No. 10-2022-0164391, filed on Nov. 30, 2022, in the Korean Intellectual Property Office, the disclosure of which is incorporated herein in its entirety by reference.

BACKGROUND OF THE DISCLOSURE

1. Field of the Disclosure

The present disclosure relates to a substrate processing apparatus and a substrate processing method. More specifically, the present disclosure relates to a substrate processing apparatus that allows a chemical liquid to penetrate deeply into a gap between patterns provided on a wafer, and a substrate processing method using the same.

2. Description of the Related Art

A semiconductor device is manufactured through several steps, including a diffusion process, a photo process, an etching process, and a deposition process. In this regard, a cleaning process is performed between adjacent ones of the diffusion process, the etching process, and the polishing process.

In recent years, as technology has become more advanced such that a substrate pattern becomes finer, the cleaning process is an important process to improve a yield of the semiconductor device. The cleaning process may remove impurities on a substrate surface via chemical substance treatment, gas supply, and physical scheme.

For this cleaning process, various types of chemical liquids may be used. A concentration and a temperature of the chemical liquid may be adjusted in a chemical liquid supply apparatus before the chemical liquid is sprayed onto the substrate. The chemical liquid is sprayed onto a center of the substrate, and then flows to an outer area thereof under a centrifugal force of a rotating substrate, and penetrates between patterns of the substrate.

However, in this scheme, when the chemical liquid flows into between the patterns of the substrate, resistance applied to the chemical liquid increases as the chemical liquid flows toward a wall of the pattern, such that a penetration depth of the chemical liquid is limited. Therefore, it is difficult to remove impurities near and at a bottom of the pattern, and this problem becomes more severe when a spacing between the patterns of the substrate is smaller, or when the pattern is formed as a hole pattern.

SUMMARY OF THE DISCLOSURE

The present disclosure is intended to solve several problems, including the above-mentioned problems. A purpose of the present disclosure is to provide a substrate processing apparatus and a substrate processing method in which a damage to the substrate due to physical or chemical schemes may be suppressed, and the chemical liquid may penetrate deeply into a gap between the patterns of the substrate during the cleaning process.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means illustrated in the claims and combinations thereof.

According to one aspect of the present disclosure, a substrate processing apparatus is provided. The substrate processing apparatus includes a chamber having a processing space defined therein in which a substrate is processed; a chuck installed in the processing space and configured to support the substrate thereon; a chemical liquid supply formed on top of the chuck and configured to supply a chemical liquid droplet toward an upper surface of the substrate supported on the chuck; and a pressurizer formed on top of the chuck and configured to pressurize the chemical liquid droplet supplied on the upper surface of the substrate so that the pressed chemical liquid droplet fills a gap between patterns formed on the substrate.

In one implementation of the substrate processing apparatus, the pressurizer includes: a pressure applying unit configured to control a signal to pressurize a pressing plate introduced into the chamber; and a pressing head configured to press the pressing plate.

In one implementation of the substrate processing apparatus, a lower surface of the pressing plate includes a superhydrophobic material.

In one implementation of the substrate processing apparatus, the pressurizer includes a pressing head configured to press an entirety of the upper surface of the substrate.

In one implementation of the substrate processing apparatus, a lower surface of the pressing head includes a superhydrophobic material.

In one implementation of the substrate processing apparatus, the chuck includes a built-in heater therein configured to heat the substrate.

In one implementation of the substrate processing apparatus, the apparatus further comprises a sprayer disposed in a lower portion of the processing space of the chamber and configured to spray a cleaning substance toward a lower surface of the pressing head or the pressing plate.

In one implementation of the substrate processing apparatus, the cleaning substance includes one of gas, a cleaning liquid, and an ultrasonic-wave applied medium to which ultrasonic energy has been applied.

In one implementation of the substrate processing apparatus, the ultrasonic-wave applied medium include deionized water (DIW).

In one implementation of the substrate processing apparatus, the apparatus further comprises a controller electrically connected to the chemical liquid supply and the pressurizer, wherein the controller is configured to: receive chemical liquid droplet supply timing information from the chemical liquid supply; and apply a control signal to the pressurizer based on the chemical liquid droplet supply timing information such that the pressurizer applies a pressure on the substrate at the same timing as the chemical liquid droplet supply timing information.

In one implementation of the substrate processing apparatus, after receiving the chemical liquid droplet supply timing information, the controller is further configured to apply a control signal to a pressing plate supply unit based on the chemical liquid droplet supply timing information so that the pressing plate supply unit introduces the pressing plate into the processing space of the chamber.

In one implementation of the substrate processing apparatus, after the pressing plate has been introduced into the chamber, the controller is further configured to apply a pressing plate alignment control signal so that the pressing plate is aligned with the substrate.

In one implementation of the substrate processing apparatus, after the alignment of the pressing plate with the substrate has been completed, the controller is further configured to apply a control signal to the pressure applying unit to press the pressing plate onto the chemical liquid droplet.

According to one aspect of the present disclosure, a substrate processing method is provided. The substrate processing method uses a substrate processing apparatus, wherein the substrate processing apparatus includes: a chamber having a processing space defined therein in which a substrate is processed; a chuck installed in the processing space and configured to support the substrate thereon; a chemical liquid supply formed on top of the chuck and configured to supply a chemical liquid droplet toward an upper surface of the substrate supported on the chuck; and a pressurizer formed on top of the chuck and configured to pressurize the chemical liquid droplet supplied on the upper surface of the substrate so that the pressed chemical liquid droplet fills a gap between patterns formed on the substrate, wherein the method comprises: a substrate loading step in which the substrate is loaded and supported on the chuck in the processing space of the chamber; a chemical liquid supply step in which the chemical liquid droplet is supplied toward the upper surface of the substrate; and a pressurizing step in which the pressurizer pressurizes the chemical liquid droplet supplied on the upper surface of the substrate such that the chemical liquid droplet fills the gap between the patterns formed on the substrate.

In one implementation of the substrate processing method, the pressurizing step includes: introducing a pressing plate into the processing space of the chamber such that the pressing plate is ready to press the upper surface of the substrate; aligning the introduced pressing plate with the substrate; and pressurizing the pressing plate onto the chemical liquid droplet so that the pressed chemical liquid droplet fills the gap between the patterns formed on the substrate.

In one implementation of the substrate processing method, the pressurizing step includes pressurizing, by the pressurizer, an entirety of the upper surface of the substrate such that the pressed chemical liquid droplet fills the gap between the patterns formed on the substrate.

In one implementation of the substrate processing method, the pressurizing step includes heating, by a heater built into the chuck, the substrate to evaporate the chemical liquid simultaneously with the pressurizing of the substrate.

In one implementation of the substrate processing method, the method further comprises, after the pressurizing step, a cleaning step of cleaning a lower surface of the pressurizer or the pressing plate.

In one implementation of the substrate processing method, the cleaning step including spraying a cleaning substance toward the lower surface of the pressurizer or the pressing plate.

According to still another aspect of the present disclosure, a substrate processing apparatus is provided. The substrate processing apparatus includes a chamber having a processing space defined therein in which a substrate is processed; a chuck installed in the processing space and configured to support the substrate thereon; a chemical liquid supply formed on top of the chuck and configured to supply a chemical liquid droplet toward an upper surface of the substrate supported on the chuck; and a pressurizer formed on top of the chuck and configured to pressurize the chemical liquid droplet supplied on the upper surface of the substrate so that the pressed chemical liquid droplet fills a gap between patterns formed on the substrate, wherein the pressurizer includes: a pressure applying unit configured to control a signal to pressurize a pressing plate introduced into the chamber; and a pressing head configured to press the pressing plate, wherein the chuck includes a built-in heater therein configured to heat the substrate, wherein the apparatus further comprises a sprayer disposed on top of the chuck and configured to spray a cleaning substance toward a lower surface of the pressing head or the pressing plate, wherein the cleaning substance includes one of gas, a cleaning liquid, and an ultrasonic-wave applied medium to which ultrasonic energy has been applied, wherein the apparatus further comprises a controller electrically connected to the chemical liquid supply and the pressurizer, wherein the controller is configured to: receive chemical liquid droplet supply timing information from the chemical liquid supply; and apply a control signal to the pressurizer based on the chemical liquid droplet supply timing information such that the pressurizer applies a pressure on the substrate at the same timing as the chemical liquid droplet supply timing information, wherein after receiving the chemical liquid droplet supply timing information, the controller is further configured to apply a control signal to a pressing plate supply unit based on the chemical liquid droplet supply timing information so that the pressing plate supply unit introduces the pressing plate into the processing space of the chamber, wherein after the pressing plate has been introduced into the chamber, the controller is further configured to apply a pressing plate alignment control signal so that the pressing plate is aligned with the substrate, wherein after the alignment of the pressing plate with the substrate has been completed, the controller is further configured to apply a control signal to the pressure applying unit to press the pressing plate onto the chemical liquid droplet, wherein a lower surface of the pressing plate includes a superhydrophobic material.

According to the aspects and the implementations of the present disclosure as described above, the chemical liquid coated on the upper surface of the substrate may be pressurized using the capillary phenomenon such that the chemical liquid may penetrate deeply into the gap between the patterns without damaging the patterns formed on the substrate. Accordingly, the substrate processing apparatus and the substrate processing method that may efficiently remove the impurities near and at the bottom of the pattern may be realized.

In addition, the processing efficiency and quality of the substrate may be increased by efficiently performing the substrate cleaning process. This may reduce the cost and time occurring due to defective patterns of the substrate.

Effects of the present disclosure are not limited to the effects mentioned above, and other effects not mentioned will be clearly understood by those skilled in the art from the descriptions below.

BRIEF DESCRIPTION OF THE DRAWINGS

The above and other purposes, features and other advantages of the present disclosure will be more clearly understood from the following detailed description taken in conjunction with the accompanying drawings, in which.

DETAILED DESCRIPTION OF THE DISCLOSURE

Figure 1:
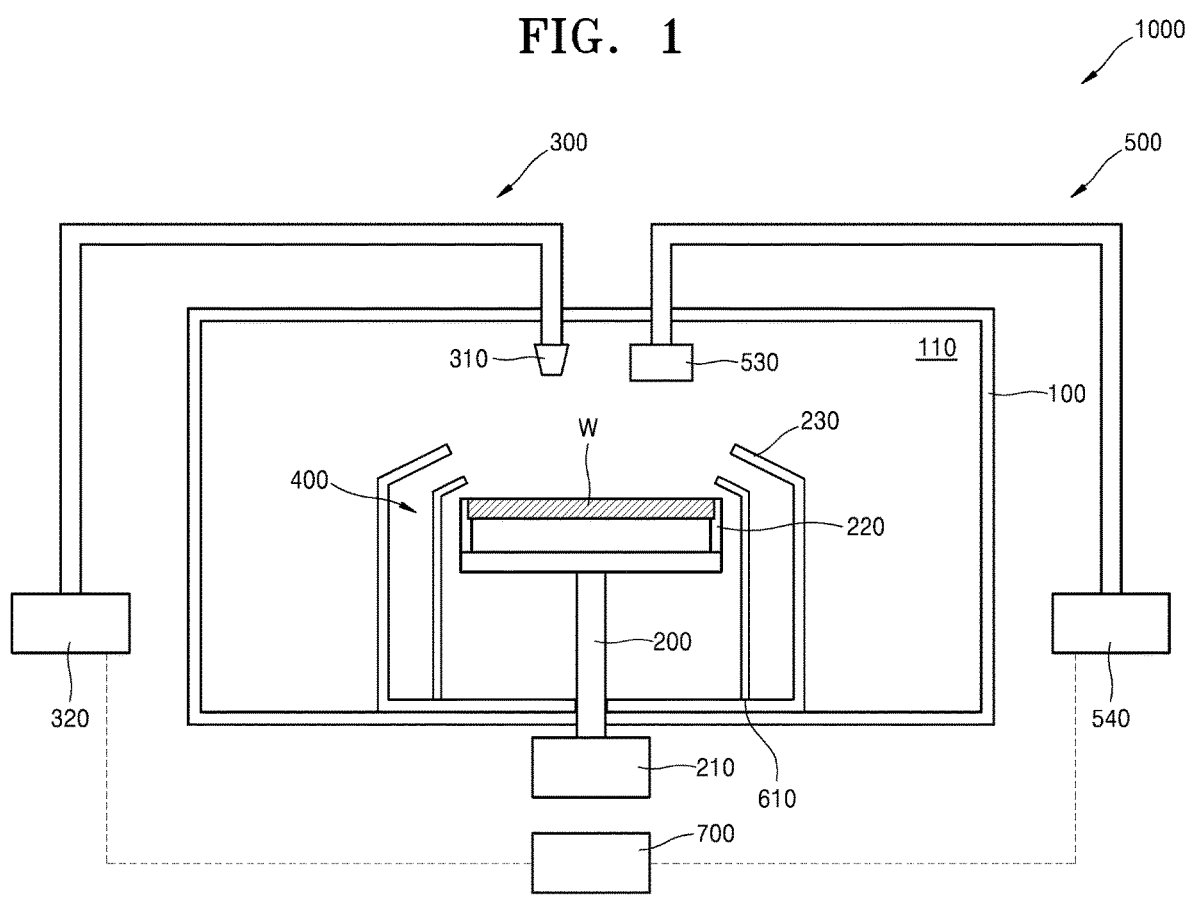
FIG. 1 is a cross-sectional view schematically showing a substrate processing apparatus according to an embodiment of the present disclosure.

Hereinafter, various preferred embodiments of the present disclosure will be described in detail with reference to the attached drawings.

The embodiments of the present disclosure are provided to more completely describe the present disclosure for those skilled in the art. The following embodiments may be modified in various forms, and the scope of the present disclosure is not limited to the following embodiments. Rather, these embodiments are provided so that the present disclosure is thorough and complete, and are provided to fully convey the spirit of the present disclosure to those skilled in the art. Furthermore, a thickness or a size of each layer in the drawing is exaggerated for convenience and clarity of illustration. A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof.

Hereinafter, embodiments of the present disclosure will be described with reference to drawings schematically showing ideal embodiments of the present disclosure. In the drawings, variations of a depicted shape may be expected, depending, for example, on manufacturing techniques and/or tolerances. Therefore, the embodiments of the present disclosure should not be construed as being limited to the specific shape of the area shown herein, and should include, for example, change in a shape caused in a manufacturing process.

Figure 8:
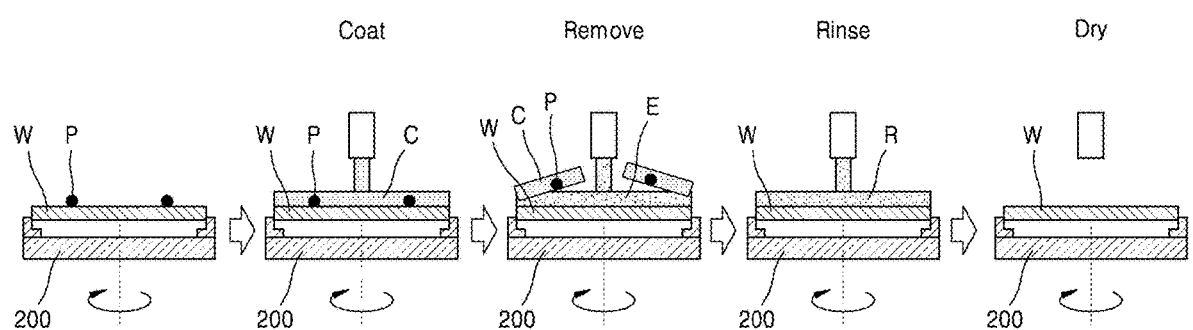
FIG. 8 and FIG. 9 are diagrams for illustrating a conventional substrate cleaning method.
Figure 9:
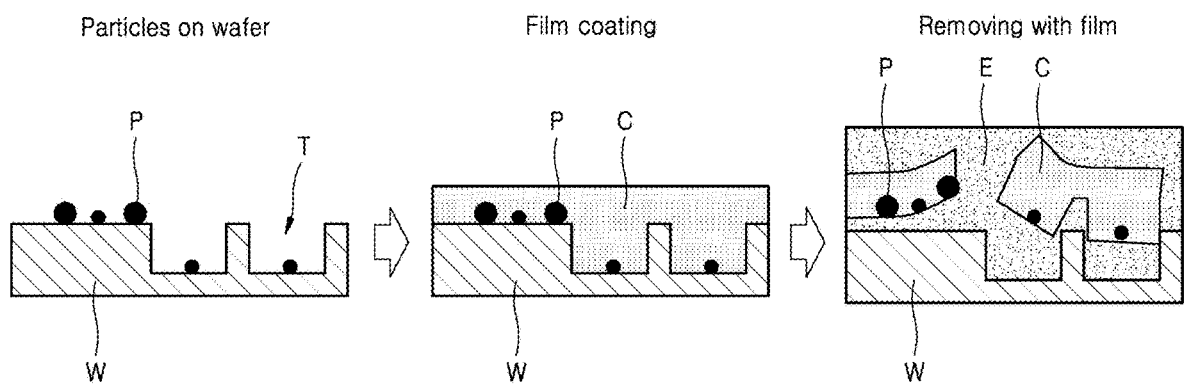

FIG. 8 and FIG. 9 are diagrams for illustrating a conventional substrate cleaning method.

First, referring to FIG. 8, in a conventional substrate cleaning apparatus, particle removal is performed using physical force or a chemical action of a chemical liquid. However, in these schemes, there is a risk that a pattern formed on a surface of a substrate W may be damaged by the physical force, or that an underlying film of the substrate W may eroded under an etching effect.

Specifically, referring to FIG. 9, the substrate W is placed on a chuck 200, and a chemical liquid (or a chemical droplet) C is discharged toward the substrate W while rotating the substrate W having particles P attached thereto. The chemical liquid C contains a volatile component, and may be embodied as a processing liquid for film formation to form a top coat film on the substrate W. The processing liquid forms a protective film applied to an upper surface of a resist film to prevent an immersion fluid from invading into the resist film. The immersion fluid is, for example, a liquid used for liquid immersion exposure in a lithography process. However, a type of the chemical liquid C is not limited to the above embodiment.

The chemical liquid C is simply discharged toward a center of the substrate W. As the substrate W rotates, the chemical liquid C flows to an outer area under a centrifugal force, and fills a gap between patterns T formed on the substrate W. In this regard, when a rotation speed of the substrate W is constant, the centrifugal force increases as a position is displaced towards the outer edge of the substrate W. Thus, a phenomenon in which the chemical liquid C is concentrated towards the outer area of the substrate W occurs. In addition, due to the stronger centrifugal force, the chemical liquid C may not sufficiently fill the gap between the patterns T in the inner area of the substrate.

Referring back to FIG. 8, etchant E is discharged toward the center of the substrate W having the chemical liquid C coated thereon to remove the chemical liquid fixed to the particles under a chemical reaction with the particles P from the substrate W. Afterwards, rinse liquid R is discharged toward the center of the substrate W to rinse the substrate W. The substrate W from which the particles P have been removed through a drying process is transferred to be subjected to a subsequent process. During the cleaning process, the substrate W may continue to rotate.

In this regard, cleaning efficiency greatly depends on a chemical liquid filling ratio into the gap between the patterns T. In other words, the higher the chemical liquid filling ratio, the higher the cleaning efficiency. However, in the prior art, the filing rate inevitably decreases as the position is displaced toward the outer edge of the substrate W due to the above-mentioned physical phenomenon. This phenomenon causes nonuniform cleaning of the substrate W, which may lower a production yield of a semiconductor device.

To solve this problem, in accordance with the present disclosure, provided are a substrate processing apparatus and a substrate processing method in which may remove the particles located deeply into the gap between the patterns by applying a chemical liquid droplet onto the substrate and pressurizing the droplet to generate the capillary phenomenon such that the pattern damage caused by physical or chemical substrate processing scheme may be minimized, and a difference between the chemical liquid filling ratios of the central and outer areas of the substrate may be reduced.

FIG. 1 is a cross-sectional view schematically showing a substrate processing apparatus according to an embodiment of the present disclosure.

Referring to FIG. 1, a substrate processing apparatus 1000 according to an embodiment of the present disclosure may include a chamber 100, a chuck 200, a chemical liquid supply 300, and a pressurizer 500.

The chamber 100 may have a processing space 110 defined therein for processing the substrate W therein. For example, the chamber 100 may have the processing space 110 defined therein in various shapes, including a circular cylindrical shape or a polygonal cylindrical shape, so that a cleaning process on the substrate W may proceed therein.

The chuck 200 may be installed in the processing space 110 and may be configured to support the substrate W thereon. Specifically, the chuck 200 may include a substrate support pin 220 and a heater (not shown). For example, the heater (not shown) may perform a function of heating the substrate W to evaporate the chemical liquid coated on the substrate W.

The chuck 200 may be formed on top of the driver 210 and may have a support plate. The substrate W may be seated on the support plate. For example, the support plate may be formed to have an overall circular shape so as to correspond to the substrate W.

For example, the support plate may have a vacuum hole (not shown) defined therein to stably adsorb and support the substrate W through a vacuum. The vacuum hole (not shown) may be connected to a vacuum line and a vacuum apparatus.

Accordingly, various types of holes including the vacuum hole may be formed therein and may be used to meet the user's purpose, and thus, an efficient substrate processing process may be performed.

The substrate support pin 220 may be formed on an upper surface of the support plate. The number of the substrate support pins 220 may be at least one. The substrate support pin 220 may support the substrate W thereon.

Specifically, a plurality of substrate support pins 220 may be radially arranged around a center of the support plate so as to be spaced from each other by a predetermined angular distance. Accordingly, the substrate W may be stably supported by the substrate support pins 220.

More specifically, the substrate support pin 220 may be formed in a shape such that at least a portion thereof surrounds a side surface of the substrate W. Therefore, the side surface of the substrate W may be supported by the substrate support pins 220 such that misalignment of the substrate W may be prevented.

The chuck 200 may be installed in the processing space 110 so as to be rotatable about a vertical shaft. The vertical shaft may be understood as a rotation shaft, and may be connected to a power apparatus, that is, the driver 210 disposed thereunder so as to provides a rotating power to rotate the substrate W. The power apparatus may control a rotation speed or a rotation time of the rotation shaft.

The chuck 200 may include a bowl 230. Specifically, the bowl 230 may be constructed to surround the chuck 200 and the substrate W seated on the chuck. Accordingly, the chamber 100 may be prevented from being contaminated by a chemical liquid droplet C which will be described later in FIG. 5 as supplied to the substrate W.

More specifically, a discharge hole (not shown) may be formed in a lower surface of the bowl 230 so that the chemical liquid droplet C sprayed onto the substrate W may be quickly discharged through the discharge hole.

The chemical liquid supply 300 may be formed on top of the chuck 200 and may supply the chemical liquid droplet C toward the upper surface of the substrate W supported on the chuck 200.

The chemical liquid supply 300 may include a chemical liquid supply line, an injection nozzle 310, and a chemical liquid supply source 320.

At least one chemical liquid supply line is configured to supply the chemical liquid droplet C to the substrate W. For example, the chemical liquid supply line may include a control valve (not shown) to control an amount of the chemical liquid droplet C to be supplied thereto.

The injection nozzle 310 may be formed at a rear end of the chemical liquid supply line and may include an injection hole that sprays the chemical liquid droplet C onto the substrate W.

For example, the injection nozzle 310 may be formed on top of the substrate. The injection nozzle 310 may be movable vertically such that a vertical level at which the chemical liquid droplet C is sprayed may be adjusted depending on a vertical level of each of the substrate W and the chuck 200. Additionally, the injection nozzle 310 may be configured to move in a horizontal direction in association with a pressurizer 500, which will be described later.

The chemical liquid supply source 320 may be connected to a front end of the chemical liquid supply line and may supply at least one chemical liquid droplet C through the chemical liquid supply line to the injection nozzle 310.

For example, the chemical liquid droplet C supplied from the chemical liquid supply source 320 may be made of an isopropyl alcohol chemical liquid (IPA). However, the present disclosure is not limited thereto and the chemical liquid droplet C may include various types of substances that can clean the substrate W.

The pressurizer 500 may be formed on top of the chuck 200 and may pressurize the chemical liquid droplet C supplied on the upper surface of the substrate W such that the chemical liquid droplet C may fill a gap between the patterns formed on the substrate W. The pressurizer 500 may include an aligner (not shown) that supports a pressing plate L inserted into the chamber 100 and aligns the pressing plate L with the substrate W, a pressure applying unit 540 that controls a signal to pressurize the pressing plate L, and a pressing head 530 capable of pressing the pressing plate L.

A lower surface of the pressing plate L may include a superhydrophobic material and may press the chemical liquid droplet C supplied on the substrate W to induce a capillary phenomenon between the pressing plate L and the substrate W such that an entire upper surface of the substrate W can be coated with the chemical liquid.

The aligner (not shown) performs the function of aligning the pressing plate L with the substrate W such that the pressing plate L is accurately positioned on the substrate W. In addition to aligning the pressing plate L with the substrate W, the aligner may perform alignment of the pressing head 530 of the pressurizer 500 with the pressing plate L. When the alignment of the pressing plate L and the pressing head 530 with each other has been completed, the pressing head 530 may receive the signal from the pressure applying unit 540 so that the pressing head 530 may pressurize the pressing plate L.

In another example, the pressing head 530 may be designed to directly press the substrate W without the pressing plate L. In this case, a lower surface of the pressing head 530 may include a superhydrophobic material so that the pressing head 530 may directly press the entire upper surface of the substrate W. A detailed description of the pressurization scheme and the cleaning method according to the above embodiments will be described later with reference to FIG. 2 to FIG. 7.

In one example, the substrate processing apparatus 1000 further includes a sprayer 610 disposed in a lower portion of the inner space of the chamber and configured to spray a cleaning substance toward the lower surface of the pressing head 530 or the pressing plate L.

The sprayer 610 performs the function of spraying the cleaning substance to clean the lower surface of the pressing head 530 or the pressing plate L contaminated by the chemical liquid or particles after the cleaning of the substrate W has been completed. For example, the cleaning substance may include one of gas, a cleaning liquid, and an ultrasonic-wave applied medium to which the ultrasonic energy is applied. The ultrasonic-wave applied medium may include deionized water (DIW).

For example, the sprayer 610 may be disposed in a lower portion of the inner space of the chamber 100 and may upwardly protrude from a side surface of the chuck 200 within the bowl 230. The sprayer 610 may include a back nozzle (not shown) and an ultrasonic applicator (not shown).

The back nozzle (not shown) may spray the ultrasonic-wave applied medium toward the lower surface of the pressing head 530 or the pressing plate L.

The back nozzle (not shown) may be connected to an ultrasonic-wave applied medium supply source and an ultrasonic-wave applied medium supply line. For example, the ultrasonic-wave applied medium supply line may be configured to include a control valve (not shown) to control an amount of the ultrasonic-wave applied medium to be supplied.

Specifically, the ultrasonic applicator (not shown) may be configured to include an ultrasonic transducer (not shown), an ultrasonic oscillator (not shown), and an ultrasonic controller (not shown).

The ultrasonic transducer (not shown) converts an electrical signal from the ultrasonic oscillator into mechanical vibrations. The ultrasonic transducer (not shown) may apply the vibrations of the ultrasonic range to the back nozzle (not shown). For example, a variety of ultrasonic transducers (not shown) such as a nickel ultrasonic transducer, a ferrite ultrasonic transducer, a piezoelectric ceramic ultrasonic transducer, a BLT ultrasonic transducer, and a crystal ultrasonic transducer may be used as the ultrasonic transducer.

For example, the ultrasonic transducer (not shown) may be generally formed in a ring shape or in a hollow cylindrical shape so as to surround at least a portion of an outer surface of the back nozzle (not shown).

In another example, at least a portion of the ultrasonic transducer (not shown) may be disposed inside the back nozzle (not shown). A size or a shape of the ultrasonic transducer (not shown) may be set or formed in various ways as long as the at least a portion of the ultrasonic transducer (not shown) is disposed inside the back nozzle (not shown).

The ultrasonic oscillator is a device that generates a high-frequency electrical signal, typically in the ultrasonic range. The ultrasonic oscillator (not shown) may apply the high-frequency electrical signal in the ultrasonic range to the ultrasonic transducer (not shown). For example, an ultrasonic oscillator (not shown) may be connected to the ultrasonic controller (not shown).

The ultrasonic controller (not shown) may adjust a frequency of the high-frequency electrical signal in the ultrasonic range. Accordingly, the ultrasonic vibrations of the frequency set by the user depending on the type or the purpose of the pressing head 530 or the pressing plate L may be applied to the ultrasonic-wave applied medium. The back nozzle (not shown) may spray the ultrasonic-wave applied medium toward the lower surface of the pressing head 530 or the pressing plate L.

The substrate processing apparatus 1000 may further include a controller 700.

The controller 700 may be electrically connected to the chemical liquid supply 300 and the pressurizer 500 and may receive chemical liquid droplet supply timing information from the chemical liquid supply 300, and may apply a control signal to the pressurizer 500 based on the chemical liquid droplet supply timing information so that the pressurizer 500 may apply a pressure on the substrate W exactly at the chemical liquid droplet supply timing information.

After receiving the chemical liquid droplet supply timing information, the controller 700 may apply a control signal to a pressing plate supply unit (not shown) based on the chemical liquid droplet supply timing information so that the pressing plate supply unit (not shown) may insert the pressing plate L into the chamber 100.

After the pressing plate L has been introduced into the chamber 100, the controller 700 may apply a control signal to the aligner (not shown) provided in the pressurizer 500 so that the aligner aligns the pressing plate L with the substrate W.

After the alignment between the pressing plate L and the substrate W has been completed, the controller 700 may apply a control signal to the pressure applying unit 540 to control the pressing head 530 to press the pressing plate L.

However, the present disclosure is not limited thereto. The controller 700 may receive information on the chemical liquid spraying timing in various ways, and may control the pressurizer 500 in various ways based on the received information. Accordingly, the supply time of the chemical liquid droplet from the chemical liquid supply 300 and the pressurization time of the pressurizer 500 may coincide with each other. Thus, as soon as the chemical liquid droplet is supplied, the pressurizer 500 may pressurize the substrate. Thus, the cleaning efficiency of the substrate W may be improved, and the cleaning process may be completed in a short time.

Hereinafter, a substrate processing method using the above-described substrate processing apparatus 1000 will be described in detail.

Figure 2:
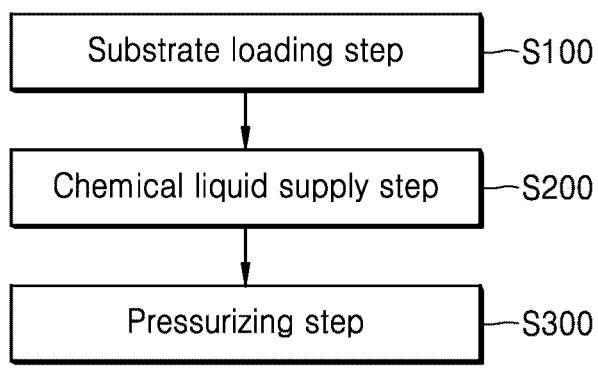
FIG. 2 is a flowchart schematically illustrating a substrate processing method according to one embodiment of the present disclosure.

FIG. 2 is a flowchart schematically showing the substrate processing method according to an embodiment of the present disclosure. FIG. 3 to FIG. 7 are diagrams for illustrating the substrate processing methods according to various examples of the embodiment as shown in FIG. 2.

First, referring to FIG. 2, the substrate processing method according to an embodiment of the present disclosure includes a substrate loading step S100, a chemical liquid spraying step S200, and a pressurizing step S300. The substrate processing method may use the substrate processing apparatus 1000 as described above and may include the substrate loading step S100 in which the substrate W is loaded and supported on the chuck 200 in the processing space 110 of the chamber 100.

The substrate loading step S100 may include a substrate moving step in which the substrate W is moved so that the substrate W is accommodated in the chamber 100 using a moving unit. For example, the moving unit may be configured to move in the vertical direction, a left and right direction, or all directions.

Figure 3:
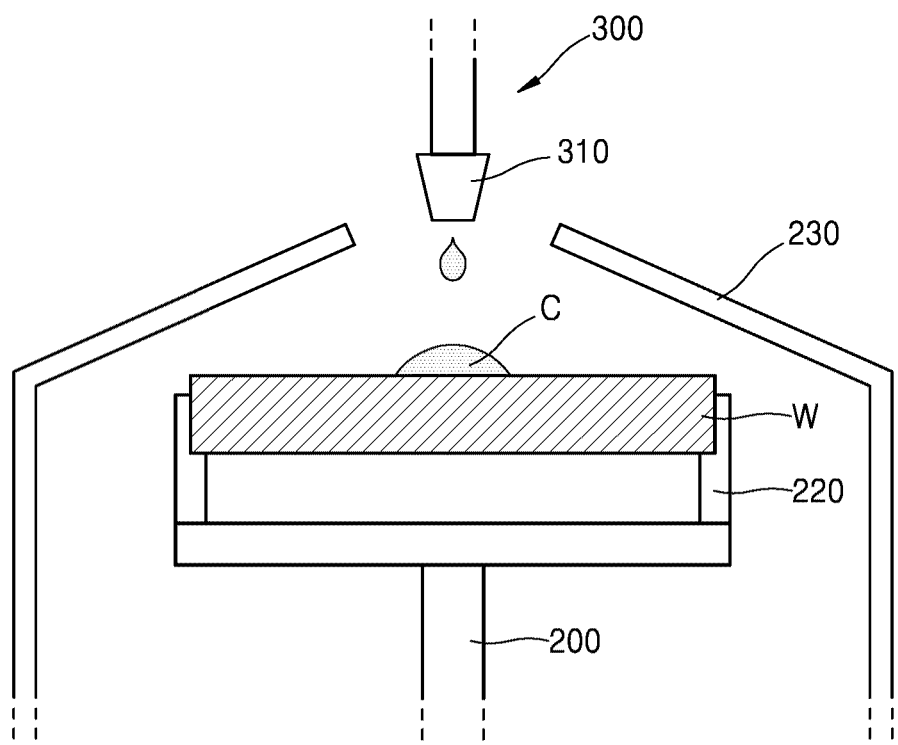
FIG. 3 to FIG. 7 are diagrams for illustrating substrate processing methods according to various examples of the embodiment as shown in FIG. 2.

Referring to FIG. 3, after the loading of the substrate W into the chamber 100 has been completed, the chemical liquid spraying step in which the chemical liquid droplet C is sprayed toward the upper surface of the substrate W may be performed.

The chemical liquid spraying step S200 may include a chemical liquid supply step in which the chemical liquid C is supplied from a chemical liquid supply source 320 through a pump, and a chemical liquid transfer step in which the supplied chemical liquid C is transferred to an injection nozzle 310 through a chemical liquid supply line. For example, the chemical liquid supply step may include a chemical liquid control step in which the amount of the chemical liquid C is adjusted before the chemical liquid C is supplied from the chemical liquid supply source 320.

The supply of the chemical liquid droplet C may be performed without rotation of the substrate W. If the chemical liquid droplet C is supplied onto the substrate W while rotating the substrate W, the chemical liquid C cannot spread into the gap between the patterns of the substrate W due to its high volatility.

Figure 4:
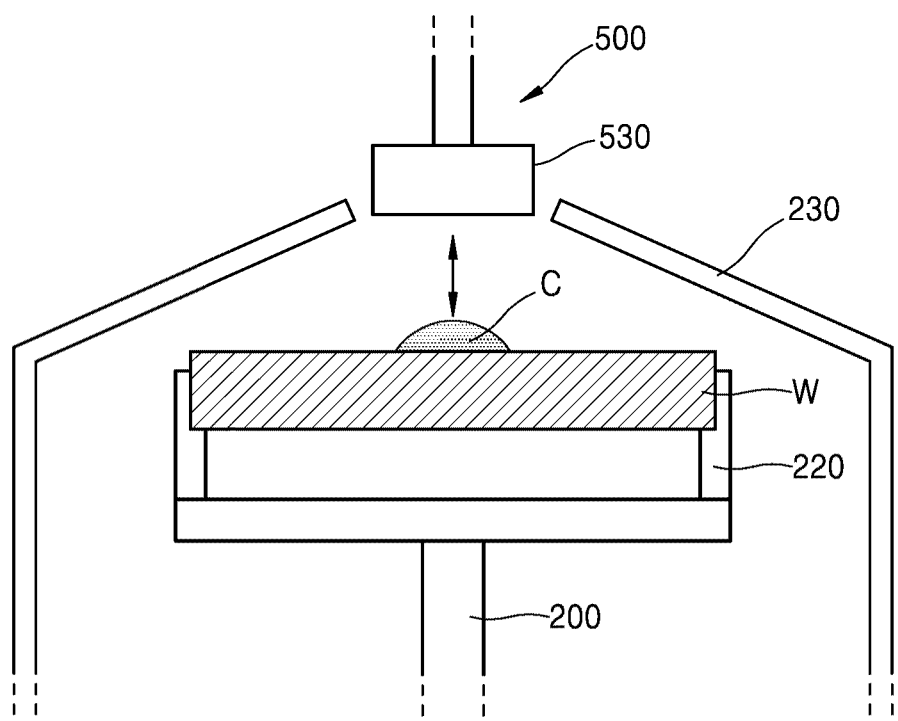

In one example, referring to FIG. 4, as the pressing head 530 of the pressurizer 500 descends toward the substrate W disposed on the chuck 200, the pressing head 530 may pressure the chemical liquid C such that the chemical liquid C may be pressurized to flow in the gap between the patterns (not shown) formed on the substrate W under the capillary phenomenon. In this regard, pressing the substrate W using the pressurizer 500 should be performed so as not to damage the pattern of the substrate W. Further, when the chemical liquid C is pressurized, the substrate W should remain stationary. If the substrate W is rotated simultaneously with the pressing event, the damage to the pattern may occur.

The narrower and deeper the gap between the patterns, the more difficult it is for the chemical liquid to penetrate deeply into the gap. However, according to the present disclosure, the pressure of the pressing head 530 that pressurizes the chemical liquid C may cause the chemical liquid C to deeply penetrate into the gap between the patterns.

Figure 5:
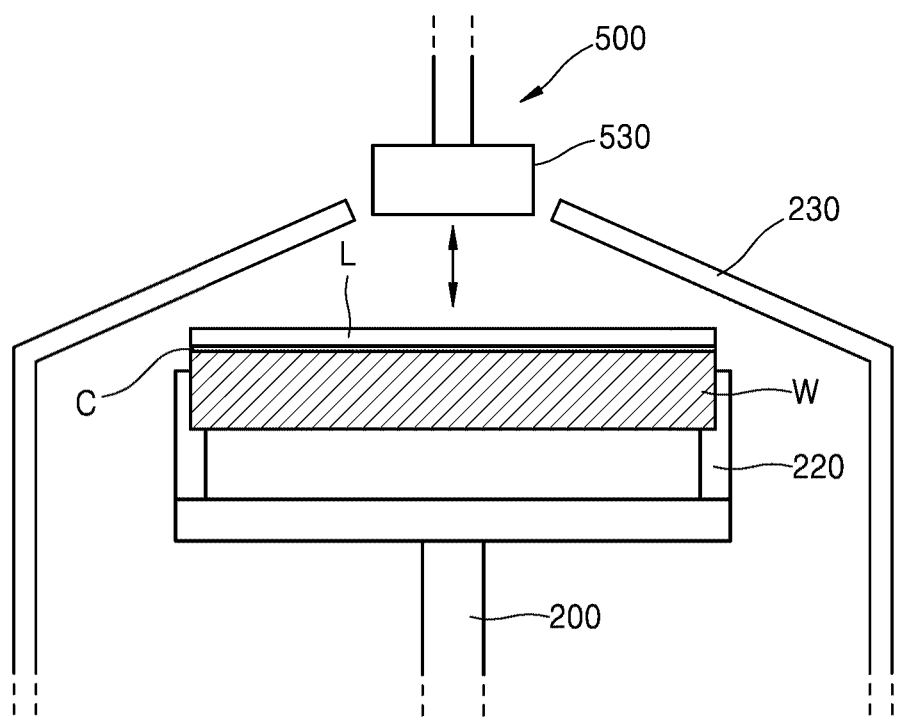

In another example, referring to FIG. 5, before the pressing head 530 of the pressurizer 500 descends toward the substrate W placed on the chuck 200, a pressing plate L loading step in which the pressing plate L is loaded into the chamber 100 such that the pressing plate L is accommodated therein may be performed.

In the pressing plate L loading step, the pressing plate L may be aligned with the substrate W onto which the chemical liquid droplet C has been supplied via the moving unit. For example, the moving unit may be configured to move in the up and down directions, the left and right directions, or all directions.

After the pressing plate L has been aligned with the substrate W onto which the chemical liquid droplet C has been supplied, the pressing head 530 of the pressurizer 500 descends towards the pressing plate L aligned with the substrate W placed on the chuck 200 and presses the chemical liquid C. Thus, the chemical liquid C may be pressurized to flow into the gap between the patterns (not shown) formed on the substrate W under the capillary phenomenon. In this regard, pressing the substrate W using the pressurizer 500 should be performed so as not to damage the pattern of the substrate W. Further, when the chemical liquid C is pressurized, the substrate W should remain stationary. If the substrate W is rotated simultaneously with the pressing event, the damage to the pattern may occur.

The pressure of the pressing head 530 that pressurizes the chemical liquid may cause the chemical liquid to deeply penetrate into the gap between the patterns.

Furthermore, a flow speed of the chemical liquid flowing between the pressing head 530 and the substrate W or between the pressing plate L and the substrate W may be expressed based on a balance of a viscous force and a surface tension. The lower the viscosity, the lower the viscous force. Thus, the lower the viscosity, the higher the flow speed of the chemical liquid, such that the chemical liquid can cover the surface of the substrate W more quickly. Therefore, the low viscosity of the chemical liquid should be maintained using a high temperature chemical liquid. The temperature of the chemical liquid may be, for example, in a range of 80° C. to 250° C.

Generally, a radius of the substrate W is larger than a height of the pattern. Thus, when the chemical liquid reaches the outer area of the substrate W, it may be determined that the gap between the patterns is entirely filled with the chemical liquid. At this time, solidification of the chemical liquid should proceed as a liquid component of the chemical liquid is volatilized. A solidification scheme will be described later with reference to FIG. 6 and FIG. 7.

The solidification scheme may selectively employ one of following two schemes.

Figure 6:
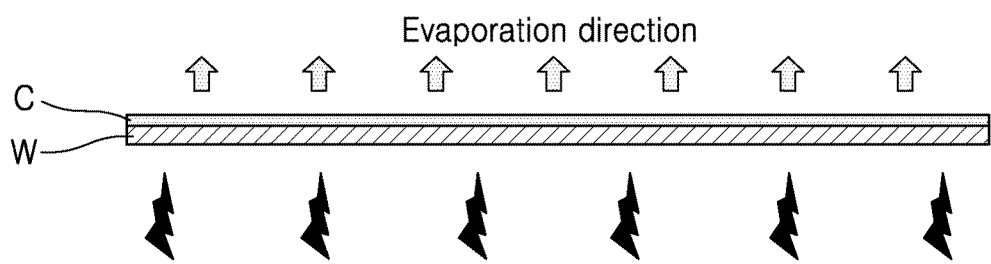

First, referring to FIG. 6, after the chemical liquid covers the entire upper surface of the substrate W, the pressing head 530 or pressing plate L may be removed and then the solidification may proceed. In this regard, the solidification may be performed by heating the substrate W using a heater (not shown) disposed in the chuck 200.

For example, when the pressing head 530 or the pressing plate L has been removed, the chemical liquid remains on the surface of the substrate W. This is because the lower surface of the pressing head 530 or the pressing plate L has the superhydrophobic property, and the surface of the substrate W has the superhydrophilic property.

While the chemical liquid remains on the substrate W, highly deionized water (HDIW) may be ejected onto the lower surface of the substrate W or a heater may be used to raise the surface temperature of the substrate W such that the liquid ingredient may be quickly volatilized. However, the chemical liquid is a polymer component. Thus, as the chemical liquid dries, its volume shrinks, such that it hardens without reaching a bottom level of the gap between the patterns formed on the substrate W. Therefore, only when using a quick drying process, the liquid component of the chemical liquid may be volatilized by heating the substrate W after removing the pressing head 530 or pressing plate L.

Figure 7:
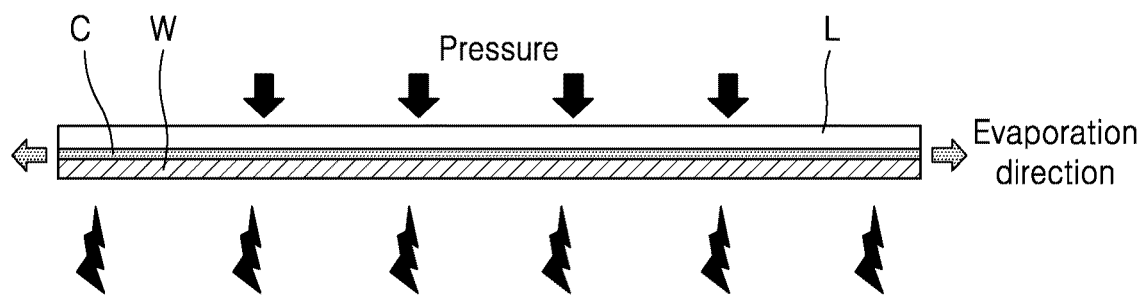

Referring to FIG. 7, after the chemical liquid covers the entire upper surface of the substrate W, the solidification may proceed while the pressing head 530 or the pressing plate L is maintained.

For example, while the pressing head 530 or the pressing plate L covers the upper surface of the substrate W, the highly deionized water (HDIW) may be ejected onto the lower surface of the substrate W or the heater may be used to raise the surface temperature of the substrate W such that the liquid component may be volatilized relatively slowly.

In this regard, an evaporation direction of the liquid component of the chemical liquid is limited toward a gap between the pressing head 530 and the substrate W or between the pressing plate L and the substrate W. Thus, an evaporation rate is lower than that when the solidification proceeds while the pressing head 530 or the pressing plate L has been removed as shown in FIG. 6.

However, because the pressing head 530 or the pressing plate L continuously pressurizes the chemical liquid, the chemical liquid reaches the bottom level of the gap between the patterns, and then hardens though the chemical liquid shrinks due to the evaporation of the liquid component of the chemical liquid. Thus, the particles located deeply in the gap between the patterns of the substrate W may be efficiently removed.

Regarding the solidification scheme, one of the two schemes as described above may be selected and performed depending on the size of the substrate W and the miniaturization of the pattern. This solidification scheme may allow the chemical liquid C to penetrate deeply into the gap between the patterns of the substrate W. Accordingly, the impurities present near or at the bottom of the gap between the patterns may be efficiently removed. This may prevent the damage to the pattern and may improve the productivity and precision of the substrate W.

After the solidification has been completed, the solidified chemical liquid may be removed using the etchant. When the solidification has been performed while maintaining the pressing head 530 or the pressing plate L, the chemical liquid may be removed after the pressing head 530 or the pressing plate L has been removed. When removing the chemical liquid using the etchant, the chemical liquid may be effectively removed while rotating the substrate W using the chuck 200. In this regard, the solidified chemical liquid may not mean a hard solid state, but a state solidified in a gel form. In addition, the etchant may be, for example, a solution that reacts chemically with the chemical liquid to dissolve the chemical liquid, or a peeling liquid that treats the chemical liquid so as to peel off.

Furthermore, the cleaning substance may be sprayed from the sprayer 610 as shown in FIG. 1 onto the lower surface of the pressing head 530 or the pressing plate L contaminated by the chemical liquid to remove contaminants attached to the pressing head 530 or the pressing plate L.

Therefore, using the substrate processing apparatus according to the present disclosure, the chemical liquid droplets may be supplied onto the substrate without rotating the substrate W, and the chemical liquid droplets may be pressed so as to penetrate deeply into the gap between the patterns of the substrate W and to remove the impurities near or at the bottom level of the gap between the patterns while preventing the damage to the pattern of the substrate W.

The present disclosure has been described with reference to the embodiments shown in the drawings. However, this is merely illustrative, and those skilled in the art will understand that various modifications and equivalent further embodiments may be made thereto. Therefore, the true scope of the present disclosure should be determined based on the technical spirit of the attached patent claims.

What is claimed is:

1. A substrate processing apparatus comprising:
a chamber having a processing space defined therein in which a substrate is processed;
a chuck installed in the processing space and configured to support the substrate thereon;
a chemical liquid supply formed on top of the chuck and configured to supply a chemical liquid droplet toward an upper surface of the substrate supported on the chuck; and
a pressurizer formed on top of the chuck and configured to pressurize the chemical liquid droplet supplied on the upper surface of the substrate so that the pressed chemical liquid droplet fills a gap between patterns formed on the substrate,
wherein the pressurizer includes a pressing plate which is a non-perforated plate and a pressing head configured to press the pressing plate.

2. The substrate processing apparatus of claim 1, wherein the pressurizer further includes:
a pressure applying unit configured to control a signal to pressurize the pressing plate introduced into the chamber.

3. The substrate processing apparatus of claim 2, wherein a lower surface of the pressing plate includes a superhydrophobic material.

4. The substrate processing apparatus of claim 1, wherein the pressing head is configured to press an entirety of the upper surface of the substrate.

5. The substrate processing apparatus of claim 4, wherein a lower surface of the pressing head includes a superhydrophobic material.

6. The substrate processing apparatus of claim 1, wherein the chuck includes a built-in heater therein configured to heat the substrate.

7. The substrate processing apparatus of claim 2, further comprising:
a sprayer disposed in a lower portion of the processing space of the chamber and configured to spray a cleaning substance toward a lower surface of the pressing head or a lower surface of the pressing plate.

8. The substrate processing apparatus of claim 7, wherein the cleaning substance includes one of gas, a cleaning liquid, and an ultrasonic-wave applied medium to which ultrasonic energy has been applied.

9. The substrate processing apparatus of claim 8, wherein the ultrasonic-wave applied medium include deionized water (DIW).

10. The substrate processing apparatus of claim 2, further comprising:
a controller electrically connected to the chemical liquid supply and the pressurizer,
wherein the controller is configured to:
receive chemical liquid droplet supply timing information from the chemical liquid supply; and
apply a control signal to the pressurizer based on the chemical liquid droplet supply timing information such that the pressurizer applies a pressure on the substrate at the same timing as the chemical liquid droplet supply timing information.

11. The substrate processing apparatus of claim 10, wherein after receiving the chemical liquid droplet supply timing information, the controller is further configured to apply the control signal to a pressing plate supply unit based on the chemical liquid droplet supply timing information so that the pressing plate supply unit introduces the pressing plate into the processing space of the chamber.

12. The substrate processing apparatus of claim 11, wherein after the pressing plate has been introduced into the chamber, the controller is further configured to apply a pressing plate alignment control signal so that the pressing plate is aligned with the substrate.

13. The substrate processing apparatus of claim 12, wherein after the alignment of the pressing plate with the substrate has been completed, the controller is further configured to apply the control signal to the pressure applying unit to press the pressing plate onto the chemical liquid droplet.

14. A substrate processing apparatus comprising:
a chamber having a processing space defined therein in which a substrate is processed;
a chuck installed in the processing space and configured to support the substrate thereon, wherein the chuck includes a built-in heater therein configured to heat the substrate;
a chemical liquid supply formed on top of the chuck and configured to supply a chemical liquid droplet toward an upper surface of the substrate supported on the chuck;
a pressurizer formed on top of the chuck and configured to pressurize the chemical liquid droplet supplied on the upper surface of the substrate so that the pressed chemical liquid droplet fills a gap between patterns formed on the substrate,
wherein the pressurizer includes:
a pressure applying unit configured to control a signal to pressurize a pressing plate introduced into the chamber; and
a pressing head configured to press the pressing plate;
a sprayer disposed on top of the chuck and configured to spray a cleaning substance toward a lower surface of the pressing head or a lower surface of the pressing plate, wherein the cleaning substance includes one of gas, a cleaning liquid, and an ultrasonic-wave applied medium to which ultrasonic energy has been applied; and a controller electrically connected to the chemical liquid supply and the pressurizer, wherein the controller is configured to:

receive chemical liquid droplet supply timing information from the chemical liquid supply; and apply a control signal to the pressurizer based on the chemical liquid droplet supply timing information such that the pressurizer applies a pressure on the substrate at the same timing as the chemical liquid droplet supply timing information, wherein after receiving the chemical liquid droplet supply timing information, the controller is further configured to apply the control signal to a pressing plate supply unit of the pressurizer based on the chemical liquid droplet supply timing information so that the pressing plate supply unit introduces the pressing plate into the processing space of the chamber, wherein after the pressing plate has been introduced into the chamber, the controller is further configured to apply a pressing plate alignment control signal so that the pressing plate is aligned with the substrate, wherein after the alignment of the pressing plate with the substrate has been completed, the controller is further configured to apply a control signal to the pressure applying unit to press the pressing plate onto the chemical liquid droplet, and wherein the lower surface of the pressing plate includes a superhydrophobic material.

* * * * *